United States Patent
Chakravorty

(10) Patent No.: US 6,181,569 B1
(45) Date of Patent: Jan. 30, 2001

(54) LOW COST CHIP SIZE PACKAGE AND METHOD OF FABRICATING THE SAME

(76) Inventor: Kishore K. Chakravorty, 6407 Berwickshire Way, San Jose, CA (US) 95120

( * ) Notice: Under 35 U.S.C. 154(b), the term of this patent shall be extended for 0 days.

(21) Appl. No.: 09/326,905

(22) Filed: Jun. 7, 1999

(51) Int. Cl.[7] ..................................................... H05K 1/18
(52) U.S. Cl. ........................... 361/761; 361/760; 361/764; 361/748; 361/758; 257/737; 257/738; 257/684; 438/613; 438/614; 228/121.1; 228/121.2
(58) Field of Search ..................................... 361/761, 760, 361/748, 750, 751, 762, 764, 777, 813; 257/737, 738, 684, 778, 779, 780, 676, 736, 700; 438/613, 614, 652, 666; 228/121.1, 121.2

(56) References Cited

U.S. PATENT DOCUMENTS

| | | | |
|---|---|---|---|
| 5,258,330 | 11/1993 | Khandros et al. | 437/209 |
| 5,477,933 | * 12/1995 | Nguyen | 174/262 |
| 5,627,405 | * 5/1997 | Chillara | 257/668 |
| 5,684,330 | 11/1997 | Lee | 257/692 |
| 5,759,873 | 6/1998 | Kata et al. | 438/118 |
| 5,767,010 | * 6/1998 | Mis et al. | 438/614 |
| 5,786,270 | * 7/1998 | Gorrell et al. | 438/613 |
| 5,798,567 | 8/1998 | Kelly et al. | 257/723 |
| 5,817,541 | 10/1998 | Averkiou et al. | 438/107 |
| 5,831,832 | 11/1998 | Gillette et al. | 361/760 |
| 5,834,830 | 11/1998 | Cho | 257/667 |
| 5,844,304 | * 12/1998 | Kata et al. | 257/620 |
| 5,858,815 | 1/1999 | Heo et al. | 438/112 |
| 5,862,816 | 1/1999 | Cho | 438/123 |
| 5,863,812 | 1/1999 | Manteghi | 438/108 |
| 5,872,051 | 2/1999 | Fallon et al. | 438/616 |
| 5,877,079 | * 3/1999 | Karasawa et al. | 438/613 |
| 5,879,964 | 3/1999 | Paik et al. | 438/113 |
| 5,886,398 | 3/1999 | Low et al. | 257/667 |
| 5,889,332 | 3/1999 | Lawson et al. | 257/778 |
| 5,891,795 | * 4/1999 | Arledge et al. | 438/613 |
| 5,892,273 | 4/1999 | Iwasaki et al. | 257/690 |
| 5,892,290 | 4/1999 | Chakravorty et al. | 257/786 |
| 5,987,744 | * 11/1999 | Lan et al. | 29/852 |

OTHER PUBLICATIONS

M. Amagai, et al., "Development of Chip Scale Packages (CSP) for Center Pad Devices", 1997 Electronic Components and Technology Conference, 1997 IEEE, pp. 343–352.

P. Elenius, "Flex on Cap—Solder Paste Bumping", 1997 Electronic Components and Technology Conference, 1997 IEEE, pp. 248–252.

(List continued on next page.)

Primary Examiner—Jeffrey A. Gaffin
Assistant Examiner—David Foster
(74) Attorney, Agent, or Firm—Skjerven Morrill MacPherson LLP; Daivd E. Steuber

(57) ABSTRACT

A first plurality of metal bumps is formed on a semiconductor wafer containing a plurality of chips, each of the first plurality of bumps being in electrical contact with a contact pad on one of the chips. An encapsulant layer is deposited over the first plurality of metal bumps and then polished to expose a top surface on each of the metal bumps. A second plurality of metal bumps is formed on the exposed top surfaces of the first plurality of plurality of bumps, respectively. The wafer is then sawed to separate the individual chips, yielding semiconductor packages which have the same lateral dimensions as the chips. Alternatively, to facilitate the encapsulation process, the wafer can be sawed into rectangular, multi-chip segments before the encapsulant layer is deposited. After the encapsulant layer has been applied and polished and the second plurality of conductive bumps have been formed, the segments are then separated into individual chips. The first plurality of metal bumps can be deposited directly on the contact pads, with or without an underbump metalization layer, or on metal conductive traces over one or more dielectric layers.

8 Claims, 9 Drawing Sheets

OTHER PUBLICATIONS

R. Fillion, et al., "Chip Scale Packaging Using Chip–on–Flex Technology", 1997 Electronic components and Technology Conference, 1997 IEEE, pp. 638–641.

J. Kloeser et al., "Fine Pitch Stencil Printing of Sn/Pb and Lead Free Solders for Flip Chip Technology", 1997 Electronic Components and Technology Conference, 1997 IEEE, pp. 254–263.

L. Levine, "Ball Bumping and Coining Operations for Tab and Flip Chip", 1997 Electronic Components and Technology Conference, 1997 IEEE, pp. 265–273.

L. Li, et al., "Stencil Printing Process Development for Low Cost Flip Chip Interconnect", 1998 Electronic Components and Technology Conference, 1998 IEEE, pp. 421–426.

G. Rinne, "Solder Bumping Methods for Flip Chip Packaging", 1997 Electronic Components and Technology Conference, 1997 IEEE, pp. 241–247.

K. Shimokawa, et al, "Micro–ball Bump for Flip Interconnections", 1998 Electronic Components and Technology Conference, 1998 IEEE, pp. 1472–1476.

Y.C. Teo, "Low Cost Chip–Scale Package", 1997 Electronic Components and Technology Conference, 1997 IEEE, pp. 358–363.

Y. Yamaji, et al., "Development of Highly Reliable CSP", 1997 Electronic Components and Technology Conference, 1997 IEEE, pp. 1022–1027.

* cited by examiner

LOW COST CHIP SIZE PACKAGE AND METHOD OF FABRICATING THE SAME

FIELD OF THE INVENTION

The present claimed invention relates to the field of semiconductor packaging. More particularly, the present claimed invention relates to a low cost process for the formation of a package which is of the same size as the IC chip.

BACKGROUND OF THE INVENTION

Semiconductor chips, commonly referred to as "integrated circuits" are an essential component of any electronic devices. These chips are usually mounted on a substrate which is also equipped with terminals for the electrical connectivity with the external world. The substrate could be either a single layer metal leadframe or a multi-layer printed wire board or likewise. Besides providing means for external electrical connectivity, these substrates also provide mechanical support to the chips. Encapsulation ensures protection of the chip from harsh physical and environmental factors. The interconnection between the chip and its supporting substrate is commonly referred to as "first level" assembly. Several approaches exist for the first level assembly of chip to a supporting substrate. These include so called "Wire-bonding", "Tape Automated Bonding (TAB)" and "Flip Chip" approaches. An encapsulated chip which is equipped with terminals for interconnection to the external world is often referred to as a chip package.

The approach for the first level connection between the chip and the substrate has strong ramifications on the overall package size, performance and reliability. In an electronic device circuit, several packages are interconnected using a common substrate. A large package size increases the distance between each chip and other chips or between each chips and other elements of the circuit. These larger distances result in longer delays in the transmission of electrical signals between chips. Consequently, the entire device is slowed down. Therefore, a reduction in package sizes leading to compact assembly can permit faster operation and therefore improved performance.

The approach used for the first level assembly of the chip to the substrate also influences the capacitances and inductances associated with the chip-to-substrate connections. Interconnections which result in large values of capacitances and inductances may result in large signal transmission delays, large switching noise and therefore performance degradation. Thus, lowering the capacitive and inductive parasitics associated with first level assembly is highly desirable.

The semiconductor chip, substrate and the encapsulant is usually made of materials which have very different material properties. Specifically, the semiconductor chip, which usually consists of silicon, has very different thermal expansion properties from the substrate materials, which can be a printed wiring board, metal lead frame or a ceramic substrate or the encapsulant material which usually consists of a epoxy resin. During the operation of the device, the electrical power dissipated within the chip tends to heat the chip and the substrate so that the temperature rises each time the chip is turned on. The chip and substrate material expand by different amounts each time the temperature increases. This causes electrical contacts on the chip to move relative to the electrical contacts on the substrate as the temperature of the chip and substrate changes. This relative movement deforms the electrical interconnections between the chip and substrate and places them under mechanical stress. Such stresses are generated each time the device is turned on and off. Such repeated exposure to stress may lead to breakage of the electrical interconnections.

In wire-bonding, the substrate has a top surface with a plurality of electrically conductive contact pads disposed in a ring-like pattern. The chip is secured to the top surface of the substrate at the center of the ring-like pattern, so that the chip is surrounded by the contact pads on the substrate. The chip is mounted in a face-up disposition, with the back surface of the chip glued to the top surface of the substrate. The front surface of the chip faces upward, and fine wires are connected between the contacts on the front face of the chip and the contact pads on the top surface of the substrate.

Wire-bonding ordinarily can only be employed when the chip I/O pads are distributed along the periphery of the chip and the substrate connection pads surround the chip in a ring-like configuration. Furthermore, wire-bonding requires a minimum pad size of 75 microns on a side and becomes non-feasible if the relative spacing between the chip pads decreases below 50 microns. With the ever increasing number of gates in IC chips the I/O counts are also increasing. Distribution of these increasing number of I/O pads along the periphery without increasing the Si chip size is posing a big challenge. Distribution of the I/O pads on the entire surface of the chip provides a more efficient configuration but wire-bonding cannot be employed for such cases. In addition, a wire bond is associated with a high inductance values. Thus, for circuits which involve simultaneous switching of a large number of gates, as is the case in present generation of microprocessors, high inductances of the wire bonds lead to a large switching noise. Wire bonds usually fan out from the chip to the substrate. Therefore, overall package size increases considerably relative to the chip size. Therefore, from the compactness standpoint, too, wire-bonding does not provide an optimal first level assembly process.

Assembly using wire-bonding requires numerous process steps. For example in the formation of an overmolded wire-bonded Ball Grid Array package, some of the major steps consist of separating individual chips from the semiconductor wafer by sawing the wafer using a diamond impregnated saw. The wafer is usually mounted on a sticky polymer base so that the sawed chips remain stuck to the tape. Individual sawed chips are then attached to a substrate in a face-up configuration using a polymeric adhesive or a solder type of low melting point material. Usually, polymeric adhesive epoxies which are filled with metal flakes for good thermal and electrical conductivity are used for this attachment process. The adhesive joints are cured in an oxygen-free inert environment at elevated temperatures. Usually, the substrates have multiple repetitive units so as to process multiple chips. Then, the substrates with the attached dice are wire-bonded and then encapsulated. After the encapsulation process, solder balls are connected to the bottom face of the surface. These solder balls provide the external connectivity. After this step the individual Ball Grid Array packages are separated by sawing them off from the rest of the substrate carrier.

Tape automated bonding (TAB) requires a flexible tape with metal leads mounted on a polymer film. Usually, the tape leads fan out from the chip pads to the substrate connection pads. Therefore, the package is considerably larger than the chip. The flexible tape represents a new layer for interconnection and considerably adds to the cost of the package. This also requires deposition of excess metal in the form of bumps either on the connection regions of the leads or the chip pads. This is an additional process step and require processes similar to those used for IC fabrication such as lithography, etching and likewise. This adds to the cost of the process. Also, as in wire-bonding in TAB assembly, individual chips need to be sawed off from the wafer. Then these chips are bonded to a flexible tape which contains metal traces for external connectivity. Bonding a single lead at a time slows down the assembly cycle time considerably, thereby increasing the cycle time and the cost. Therefore, usually all the leads are bonded simultaneously to the chip pads in what is referred as "Gang Bonding" process. This requires very tight control of the planarity of the tape leads and the chip pads connection sites. The long TAB leads also have high inductances and therefore lead to large switching noises in fast digital circuits. From a mechanical stress standpoint, flexible tape represents a good solution because the tape can deform and absorb the stress thereby increasing the reliability of the joints.

In a flip-chip process, usually the I/O pads are distributed on the entire surface of the chip. This enables placement of a larger no of I/O pads at a increased pitch without increasing the size of the silicon chip. The I/O pads are deposited with metal bumps of materials which can melt at bonding temperatures and fuse with the substrate pad materials. As in the case with wire-bonding and TAB, individual chips have to sawed-off from the wafer before these are bonded to the substrate. The chip is bonded face-down such that the active face of the chip with the connection pads faces the top surface of the substrate. The metal bumps on the chip pads provide a separation between the chip and the substrate. These bumps are considerably shorter in length than a wirebond or a TAB lead. Therefore, inductances associated with these joints are considerably lower. These joints, which are composed of stiff metal bumps, pose a reliability challenge. When mechanical stress builds-up due to temperature changes and a resulting expansion mismatch between the chip and the substrate, the metal joints unlike TAB tape, cannot deform and relieve the stress. This leads to breakage of the joints. In order to improve the reliability, an epoxy resin material is dispensed in the region between the chip and the substrate. This so called "underfill" material encapsulates the exposed regions of the metallic joints and acts as a stress buffer thereby significantly improving the reliability. However, this underfilling step is an additional process and adds to the assembly cost by increasing the process cycle time as well as the number of constituent layers.

Several different approaches exist in the prior art for the formation of compact packages. Two representative examples, spanning the range from large to nearly chip size, are given here. The first one is what is referred to as an overmolded ball grid array (BGA) package 100, schematically shown in FIG. 1a. In this package, the chip 101 is bonded to a printed wiring board (PWB) substrate 102 in a face-up configuration. The PWB substrate has multiple layers of metal traces which are used for connecting the peripherally distributed chip contact regions 103 on the chip 101 to the external solder balls 104 which are distributed across the bottom face of the PWB substrate. Wirebonds 105 connect the chip connection pads to top layer traces on the PWB. The top half containing the chip and the wirebonded regions are encapsulated in an epoxy resin system 106.

The second example is a compact package shown schematically in FIG. 1b. In this package integrated circuit chip 200 has an elastomeric overlayer 201. Chip contact ports 202 of the integrated circuit chip 200 are exposed and not covered with the elastomeric overlayer 201. Metal traces or leads present in a flexible tape 203 are used to re-distribute the I/O ports 202 from the periphery of the chip 200 to the central region of the elastomeric overlayer 201. One end of the leads or traces in the flexible tape 203 connects to one of the I/O ports 202 via a wire bond, whereas the other end is routed over the elastomeric overlayer 201 and is deposited with a Ni metal bump 204 for external connectivity.

The overmolded BGA package shown in FIG. 1a involves wire-bonding, and due to the fan-out of the wire bonds from the chip to the substrate, the resultant package size is large. The package shown in FIG. 1b in comparison presents a much more compact size. Both these configurations use long wires or leads for connection of chip I/O ports to the substrate. Thus, inductances are generally high. Both these packages are applicable only to those chips which have peripherally distributed I/O pads. These packages require several different material layers besides the chip. The assembly process starts with the sawing-off of the individual chips from the wafer. Then the chips are mounted on carriers for furthering processing. In the overmolded BGA package, the PWB substrate needs to be custom designed to match the chip I/O pad distribution. Similarly, in the compact package of FIG. 1b, the flexible tape needs to be custom designed for each chip design. In these approaches, each of the IC chips is separated from the wafer and bonded to individual sites on a substrate or tape. Although the substrate or tape can be enlarged so as to contain multiple such individual chip connection sites, still there is a size restriction on the substrate due to the limitation of the equipment which is needed for assembly of these substrates. Consequently, the substrates could contain only a small number of such individual chip sites and therefore, only a small number of chips can be assembled in one step.

Thus, a need exists for a method of forming a chip package which has fewer steps, uses fewer materials and can use the existing conventional equipment and infrastructure. Still another need exists for an assembly method whereby large numbers of chips from a wafer can be processed simultaneously. Also, a need exists for an assembly method which does not require mounting of the individual chips on substrates or frames for processing. Still another need exists for an assembly method wherein a large number of chips which are connected together on a wafer can be mounted in one region on a substrate and then encapsulated and processed to yield individual compact packages. Still another need exists for a package which offers low inductance. A further need exists for a package which is fabricated from the conventional materials and procedures so that the assembly costs are lower.

SUMMARY OF INVENTION

The present invention provides a method and structure for a chip package wherein multiple chips which are connected to each other are assembled and encapsulated together and then sawed to form individual chip packages.

Specifically, in one embodiment, the semiconductor chip package comprises a semiconductor chip having a plurality of contact pads; a first dielectric layer overlying the chip and containing a hole, the hole overlying one of the contact pads; a metal trace extending from a location inside the hole along a surface of the first dielectric layer, the metal trace being in electrical contact with the pad; a second dielectric layer overlying the first dielectric layer and metal trace and containing a second hole, the second hole overlying the trace and being lined with a metal layer in electrical contact with the trace; a first metal bump formed in the second hole and extending above the second dielectric layer; an encapsulant layer overlying the second dielectric layer, the first metal bump extending through the encapsulant layer; and a second metal bump formed on top of and in electric contact with the first metal bump.

In addition, the invention includes a method of manufacturing semiconductor chip packages. The method includes providing a semiconductor wafer containing a plurality of chips; forming a first dielectric layer over a surface of the wafer; forming a first plurality of holes in the dielectric layer, the holes corresponding with the locations of contact pads on the surface of the wafer; depositing a first metal layer on a surface of the first dialectic layer; patterning the first metal layer to form traces, each of the traces extending from one of the first plurality of holes; depositing a second dielectric layer over the first dielectric layer and the first metal layer; forming a second plurality of holes in the second dielectric layer, each of the second plurality of holes corresponding with the location of at least one of the traces; depositing a second metal layer over the second dielectric layer, the second metal layer extending into the second plurality of holes; removing a portion of the second metal layer, leaving the second metal layer in the second plurality of holes; forming a first plurality of metal bumps in the second plurality of holes; depositing an encapsulant layer covering the first plurality of metal bumps; removing a portion of the encapsulant layer so as to expose a portion of the bumps in the first plurality of bumps; forming a second plurality of bumps on the exposed portions of the first plurality of bumps; and separating the chips by sawing the wafer, the first and second dielectric layer and the encapsulant layer, thereby producing the semiconductor chip packages.

In another embodiment, wafer is sawed into sections each containing a plurality of chips after the first plurality of metal bumps has been formed. The method then includes depositing an encapsulant layer covering the first plurality of metal bumps; removing a portion of the encapsulant layer so as to expose a portion of the bumps in the first plurality of bumps; forming a second plurality of bumps on the exposed portions of the first plurality of bumps; and separating the chips by sawing the segments, thereby producing the semiconductor chip packages.

In a different embodiment, the first plurality of metal bumps are directly deposited directly over the chip contact pad regions. As in the previous embodiments, the method then includes depositing an encapsulant layer covering the first plurality of metal bumps; removing a portion of the encapsulant layer so as to expose a portion of the bumps in the first plurality of bumps; forming a second plurality of bumps on the exposed portions of the first plurality of bumps; and separating the chips by sawing the segments, thereby producing the semiconductor chip packages. Alternatively, as described above, the wafer can be sawed into multi-chip sections after the deposition of the first metal bumps and before the encapsulation process.

The present invention provides a chip package which is compact, associated with low inductance, has good reliability and can be fabricated at a low cost.

These and other objects and advantages of the present invention will become apparent to those of ordinary skill in the art after reading the following detailed description of the preferred embodiments which are illustrated in the various drawing figures.

BRIEF DESCRIPTION OF THE DRAWINGS

The accompanying drawings, which are incorporated in and form a part of this specification, illustrate embodiments of the invention and, together with the description, serve to explain the principles of the invention:

FIG. 8a shows wafer 301 deposited with metal bumps 311 after encapsulation layer 312.

FIG. 8b is a side-sectional schematic representation of chip 302 after encapsulation which shows the various embedded elements and the encapsulating layer 312.

FIG. 8c is a schematic side-sectional representation after exposing the top surface of metal bumps 311 and creating flat metal region 313.

FIG. 8d is a schematic side-sectional representation after formation of the second plurality of metal bumps 314.

FIG. 8e shows a plan view of wafer 301 after the formation of metal bumps 314 and sawing-off along the scribe lines 303 so as to obtain individual chip packages.

FIG. 8f is a view of a chip package showing the area distributed metal bumps 314.

FIG. 9a shows wafer 301, containing plurality of first metal bumps 311, which has been sawed-off along scribe lines 316 so as to singulate sections 317 containing multiple chips.

FIG. 9b shows the sections 317 which are bonded on to a carrier frame 318.

FIG. 9c shows the encapsulated wafer sections 319 mounted on a carrier frame 318.

FIG. 9d shows wafer sections 319, after the exposure of the first plurality of metal bumps and the attachment of the second plurality of metal bumps 314-2.

FIG. 9e shows wafer section 319 after separation of the individual chip packages by sawing-off along the scribe lines 303-2.

FIG. 9f displays a chip package 315 with metal bumps 314-2.

FIG. 10a shows a wafer 301 and a chip 302 with peripheral chip contact pads 304.

FIG. 10b shows the structure after deposition of UBM layer 321.

FIG. 10c shows the structure after deposition of first plurality of metal bumps 322.

FIG. 10d shows the structure after reflow of metal bumps 323.

FIG. 10e shows the structure after deposition of the encapsulation layer 324.

FIG. 10f shows the structure after the exposure of the metal bump regions by polishing, leading to flat metal regions 325.

FIG. 10g shows the structure after the formation of second plurality of metal bumps 326 over regions 325.

FIG. 10h shows the structure after separation of a chip package 327 which has metal bumps 326.

The drawings referred to in this description should be understood as not being drawn to scale except if specifically noted.

DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover equivalent, modifications, and alternatives, which may be included within the spirit and scope of the invention as defined by the appended claims. Furthermore. in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Figure 1A:
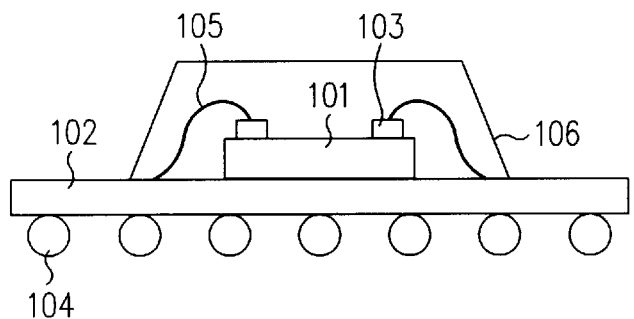
FIG. 1a is a side-sectional schematic view of an overmolded ball grid array package.
Figure 1B:
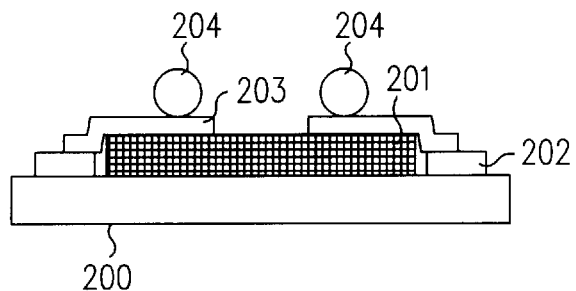
FIG. 1b is a side-sectional schematic of a compact BGA package.
Figure 2:
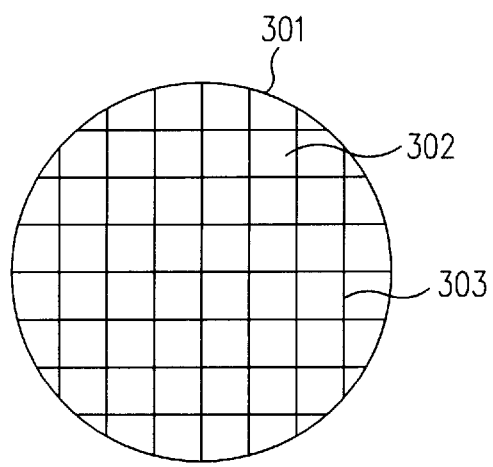
FIG. 2 is a schematic representation of a silicon wafer 301 containing multiple integrated circuit chips 302 and scribe lines 303.
Figure 3:
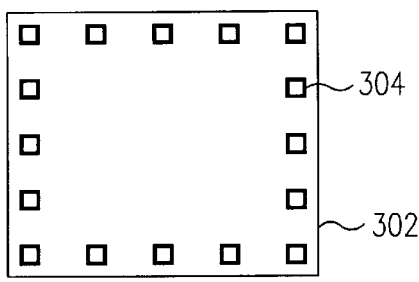
FIG. 3 is a enlarged plan view of IC chip 302 which shows the conventional peripherally distributed I/O contact pads 304.

FIG. 2 is a top plan view of a wafer 301 which contains numerous integrated circuit (IC) chips 302. Adjacent chips are separated by borders 303 referred to as scribe lines. In the present embodiment, each IC chip contains the complete integrated circuit elements. At the top layer, the chip contains regions called contact pads whereby connections for the input and output signals from the chip can be made. As shown in FIG. 3, these input and output contact pad regions, referred to as chip contact pads, are usually distributed in a ring like structure along the periphery of the chip and are illustrated as 304. An integrated circuit (IC) contains a large number of devices which are derived from transistors. In order to provide more functionality from the chip, a larger number of such devices need to be incorporated. This is referred to as increasing the integration level of the integrated circuit. As the integration level of the IC chip increases so does the number of required I/O connections in accordance with relationship called Moore's law. Thus, a larger number of chip contact pads need to be accommodated along the periphery of the chip. Increasing the size of the chip in order to accommodate these large number of chip contact pads is not economically viable due to the fact that processed silicon area is very expensive. Thus, the trend has been towards decreasing the size as well as separation of the connection pads. However, closely spaced and small contact pads are difficult to connect to the external world. Therefore, approaches have been developed for redistributing these I/O pads on the entire surface of the chip by using redistribution layers. One embodiment of the present invention uses this general approach in a novel way.

Figure 4:
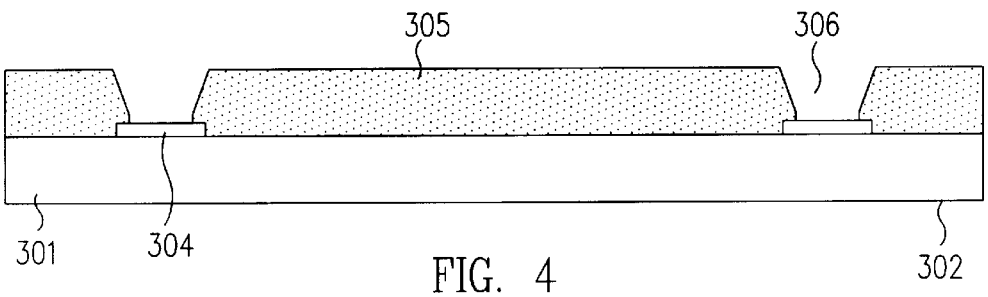
FIG. 4 is a cross-sectional view showing the chip contact pads 304, first dielectric layer 305 and plurality of holes 306 in layer 305.

Referring to FIG. 4. the redistribution step involves depositing a dielectric layer 305 on wafer 301. This could be done by means such as spin-coating, spray-coating, or extrusion-coating from a liquid solution or paste of the dielectric material. Alternatively, dielectric layer 305 could be formed by lamination using a dry film. Still another approach involves encapsulating the wafer 301 in epoxy resin using a transfer molding process. Next, clearance holes 306 are made in the dielectric layer 305 corresponding to the locations of chip contact pads 304 . This could be done by any of several established procedures. If the dielectric layer 305 is a photosensitive material such as the photosensitive polyimides, benzocyclobutenes (BCB), Novolac photoresists, photosensitive epoxy or similar materials, then the clearance holes 306 could be fabricated by well known lithographic techniques. If the dielectric layer 305 is not photosensitive, clearance holes 306 could be made by etching the film selectively over the I/O pad regions by using a mask. The etch mask is patterned so as to have clear holes over the chip contact pad regions. Examples of a non-photosensitive dielectric could be organic layers such as non-photosensitive polyimides, non-photosensitive epoxies, inorganic films such as silicon dioxide, silicon nitride, and a silicon oxynitride.

Figure 5:
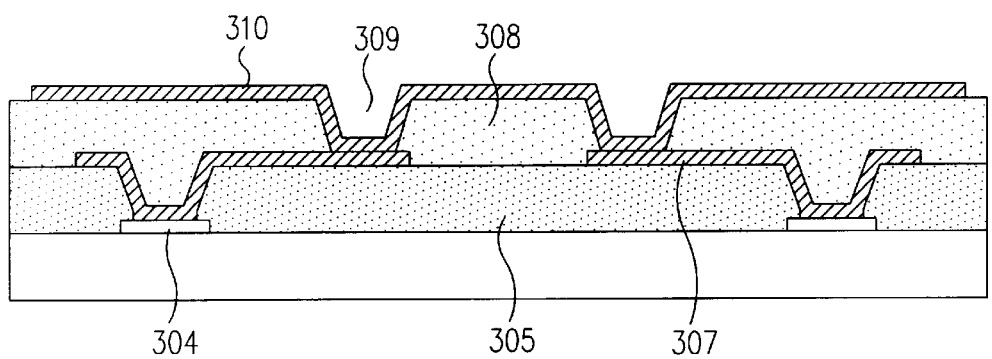
FIG. 5 is a cross-sectional view showing the chip contact pad re-distribution layers. Shown are first dielectric layer 305, metal re-distribution layer 307, and second dielectric layer 308, plurality of holes 309 in 308, and unpatterned Underball Metallization (UBM) layer 310.

As shown in FIG. 5, next a metal layer is deposited which electrically connects to the chip contact pads 304, through the clearance holes 306 in the dielectric layer. For example this metal could be aluminum, chromium, nickel or a combination of metals or multiple metal layers. The metal layer is deposited using established techniques such as sputtering, evaporation, etc. The metal layer is patterned into fine traces 307 which electrically connect to the contact pads 304 and terminate in the central regions over the dielectric layer 305. One end of traces 307 overlaps the chip pads 304 whereas the other end traverses centrally on the dielectric layer 305 and terminates such that the terminal ends of traces 307 are distributed across the entire area on the top of the dielectric layer 305.

A second dielectric layer 308 is then deposited on top of dialectic layer 305. Layer 308 could be made of the same material as dielectric layer 305 or it could be made of a different material. Clearance holes 309 are made in the second dielectric layer 308 so as to expose terminal regions of the metal traces 307 which are distributed on the chip area. A second metal layer 310 is then deposited so that it electrically connects to the first metal traces 307 through the clearance holes 309 in the dielectric layer 308. The second metal layer 310 is referred to as the "under bump metallization" (UBM).

Figure 5A:
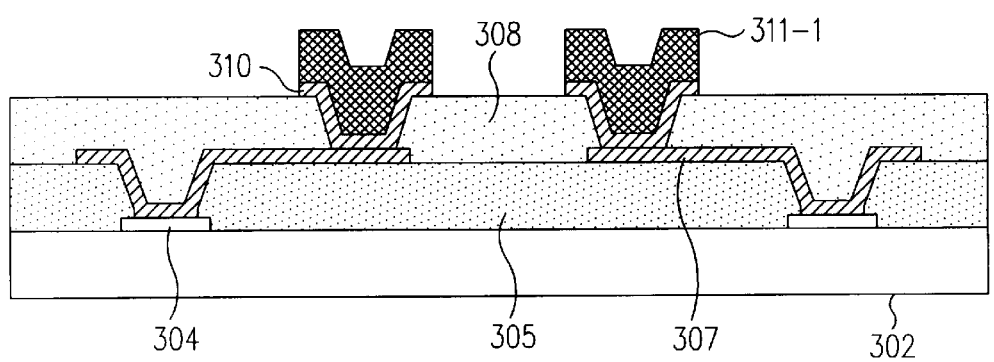
FIG. 5a is a schematic side-sectional view with the first plurality of metal bumps 311-1 after deposition.

Next, as shown in FIG. 5a, metal in the form of bumps 311-1 are deposited over UBM layer 310 selectively. Bumps 311-1 fill-up the clearance holes 309 in the dielectric layer 308 and overlay the terminals of the metal traces 307 and form a first plurality of metal bumps. Metal bumps 311-1 make good electrical contact to the UBM layer 310. The thickness of metal bumps 311-1 is in the range of 25–200 microns. Once metal bumps 311-1 have been deposited, the portions of UBM layer 310 that are not covered by bumps 311-1 are removed by etching process. This etching is done in an etchant which etches UBM layer 310 and does not etch the metal used to form bumps 311-1 very aggressively. Preferentially, during the removal of UBM layer 310, not more than 5% (by thickness) of the metal bumps 311-1 is removed. Thus, the UBM layer 310 is left in place only underneath the metal bumps 308. The remaining portions of UBM layer 310 form a number of cup-shaped regions.

The UBM layer 310 is used to ensure good wettability and adhesion of the overlying metal bumps 311-1. Thus, the choice of the material for UMB layer 308 is dependent on the metal used for bumps 311-1.

Deposition of the metal bumps 311-1 can be done by several established techniques. These include electro and electroless plating, evaporation using a metal shadow mask, or printing of a metal paste through a stencil aperture. Alternatively, a wire bonder can be used for bonding metal studs via a process referred to as "wire bonder stud bumping", wherein the wire bonder is used to deposit a gold or solder stud bump. A detailed description of this process is contained in "Ball Bumping and Coining Operations for TAB and Flip Chip" by Lee Levine, Proc. Electronics Components and Technology Conference, 1997, pp 265–267 and references therein, which is incorporated herein by reference. Examples of bump materials are 90/10 Pb/Sn solder, 63/37 Pb/Sn eutectic, and electrolessly plated nickel. For electroplated solder bumps, UBM layer 310 could be configured from a combination of Cr and Cu layers. The Cr layer functions as an adhesion or glue layer whereas the Cu layer provides a electrolytic or electroless plating seed layer for the solder material. Alternately, these same layers can also be used for solder bump deposition by other processes.

Figure 6:
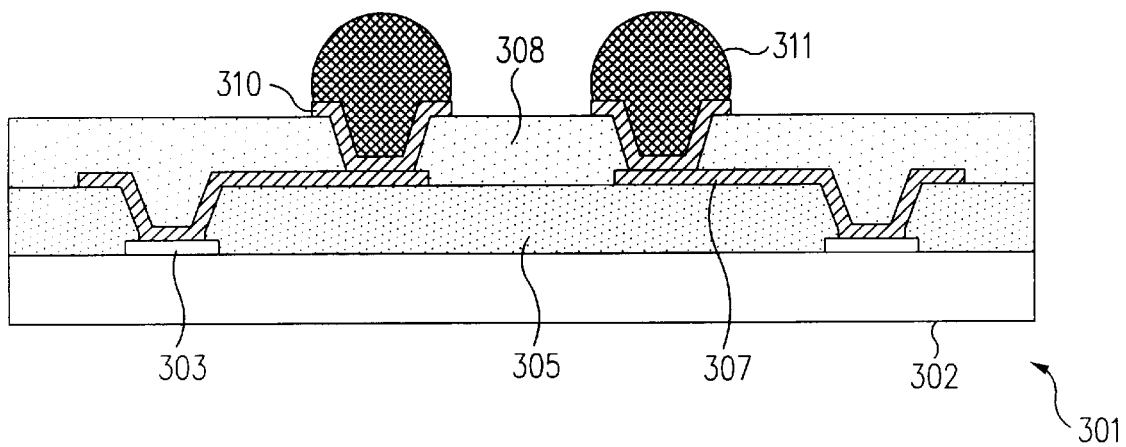
FIG. 6 is a schematic side-sectional view of wafer 301 and chip 302 with the first plurality of metal bumps 311 formed after reflow.
Figure 7:
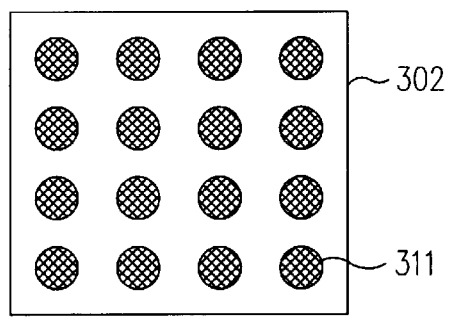
FIG. 7 is the plan view showing the area distributed first plurality of metal bumps 311 on 302.

If the bumps 311-1 are composed of a combination of different metals such as Pb/Sn solder and solder paste material wherein the solder particles are embedded in an organic binder matrix with other constituents, then wafer 301 with metal bumps 311-1 undergoes a reflow step next. This consists of heating wafer 301 to elevated temperatures in an inert environment. This reflow step causes intermixing of the constituent metals and the formation of alloys. The reflow step is also needed if the bump material consists of solder paste. For solder paste the reflow step volatilizes the organic binders and other constituents so as to give electrically conductive solder bumps. For low melting materials such as Pb/Sn solder, the reflow step may cause melting of the bumps as well. When the solder melts, the surface tension of the molten solder forms a partial spherical bump 311, as shown in FIG. 6. The base of bump 311 is determined by the width of the "cups" formed by the UBM layer 310, because the reflowed bump material such as molten solder adheres strongly to this layer. The temperature for this reflow step is determined by the composition of the bump material. For 90/10 Pb/Sn the temperature is above 300° Celsius, whereas for 63/37 Pb/Sn eutectic a much lower temperature below 250° Celsius could be employed. In some cases. reflow may not be necessary.

Figure 8A:
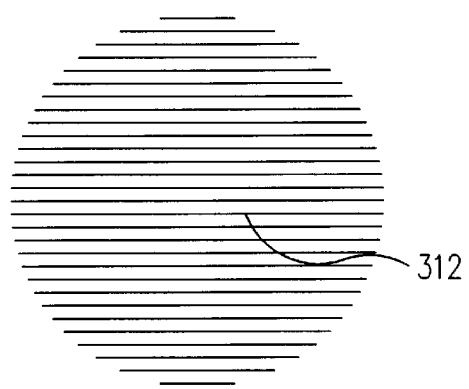
FIGS. 8a to 8f illustrate a process of fabricating a first embodiment according to the invention.
Figure 8B:
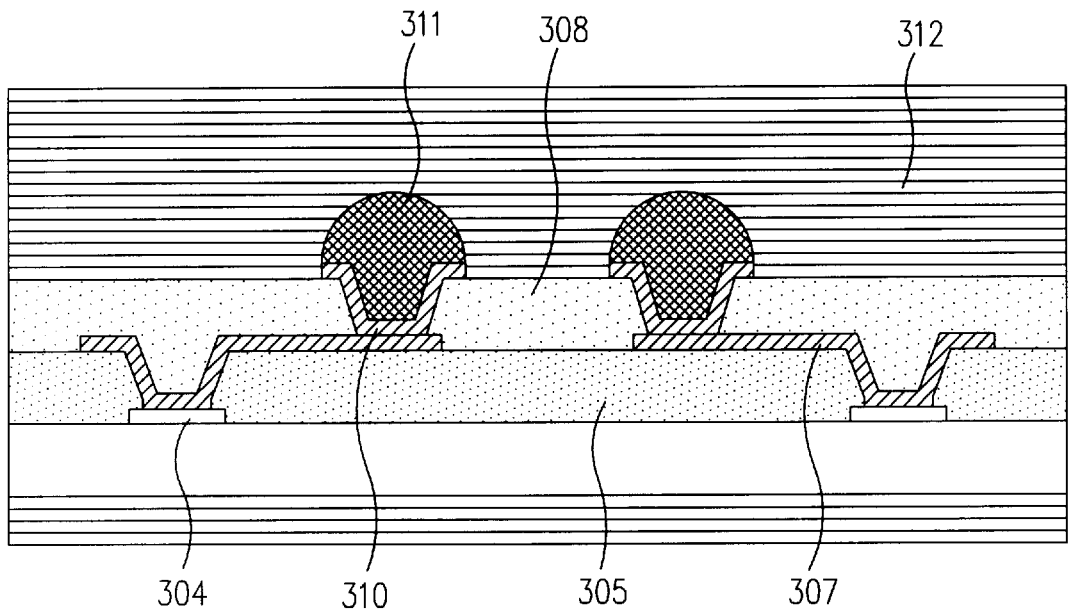

In the first preferred embodiment, after the deposition of metal bumps 311, forming the second layer of connection regions on wafer 301 (a process referred to as "bumping"), wafer 301 is encapsulated with a polymeric encapsulant layer 312, as shown in FIG. 8b. Various choices exist for the material of encapsulant layer 312. Encapsulant layer 312 could be formed from epoxy resin based mold compounds, pure epoxy resins, polyimides and other polymeric materials. In addition, encapsulating layer 312 could also be formed of inorganic materials such as silicon oxide, silicon nitride, etc. Encapsulation could be done by a number of established approaches such as transfer molding using epoxy resin based mold compounds, laminating with a dry film such as polyimide or other polymeric material, or coating from a liquid solution using techniques such as extrusion, curtain, meniscus, or spin coating. For inorganic encapsulants such as silicon oxide, one can employ coatings from liquid precursors of such films such that, after baking, inorganic oxides are formed, an example of which is the spin on glass class of materials.

Encapsulation of the wafer 301 via a transfer molding process using, epoxy resin based mold compounds uses a methodology similar to the conventional transfer molding process of integrated circuit chips. In this process, the wafer is bonded to a frame before it is transferred to the mold. This frame mechanically supports the wafer and also enables handling and automated transferring of the wafer to the mold press. The frame could be configured from conventional metal leadframe-like materials. The frame assembly with the wafer is placed in the cavity of a metal mold. Molding is done at elevated temperatures such as 175° Celsius at which the mold compound melts. The fluid mold compound is transferred to the mold cavity at under high pressure. The mold compound fills up the cavity and encapsulates the wafer. The mold compound is a thermoset material which cures and hardens subsequently. After the molding process, the encapsulated wafer is taken out from the mold. The mold could be designed so as to encapsulate only the front surface of the wafer, or alternatively it could be designed so as to encapsulate the entire wafer including the back surface.

In a different embodiment the wafer is encapsulated with a polymeric film using a lamination technique. The dry film is laminated to the wafer using an epoxy adhesive glue. The thickness of the lamination film is chosen such that the entire wafer with the metal bumps 311 is embedded in the laminate film. Preferably, the laminating film thickness is at least twice the thickness of the bumps 311. The lamination process is achieved by attaching the laminate film on to the wafer using an adhesive glue under application of pressure and heat. Either a single film or multiple films could be sequentially bonded. The lamination can be done either on the top active face of the wafer or on both the top and bottom faces. When both the faces are to be laminated, the top face is laminated first, preferably so as to protect it during the lamination of the bottom face. The polymeric film softens under heat and pressure and thus could be made to deform adequately and laminate satisfactorily to the bumped regions providing satisfactory encapsulation.

The wafer could also be encapsulated by applying a coating of a polymeric film from its liquid solution and then baking the coating dry. The coating could be done by using any of the various established approaches such as extrusion coating. As before, the front surface is encapsulated first before the back surface. Alternatively, the encapsulation could also be done using a spray-coating technique wherein liquid solution of the polymeric material is sprayed over the wafer and then heated at elevated temperatures to provide a dry encapsulating film. Still another approach is spin coating wherein a liquid solution of the polymeric material is dispensed on the wafer and the wafer is rotated at a high angular speed, which leads to an uniform coating of the layer. The thickness depends on both the viscosity of the polymeric solution as well as the rotational speed. The wafer is then heated at elevated temperatures so as to drive the solvent off, leaving behind the polymeric film. In general, spin coating is only applicable for thin films (<10 microns). Therefore, in order to build-up 50–100 micron thick coating, multiple coating and baking steps are normally required.

Figure 8C:
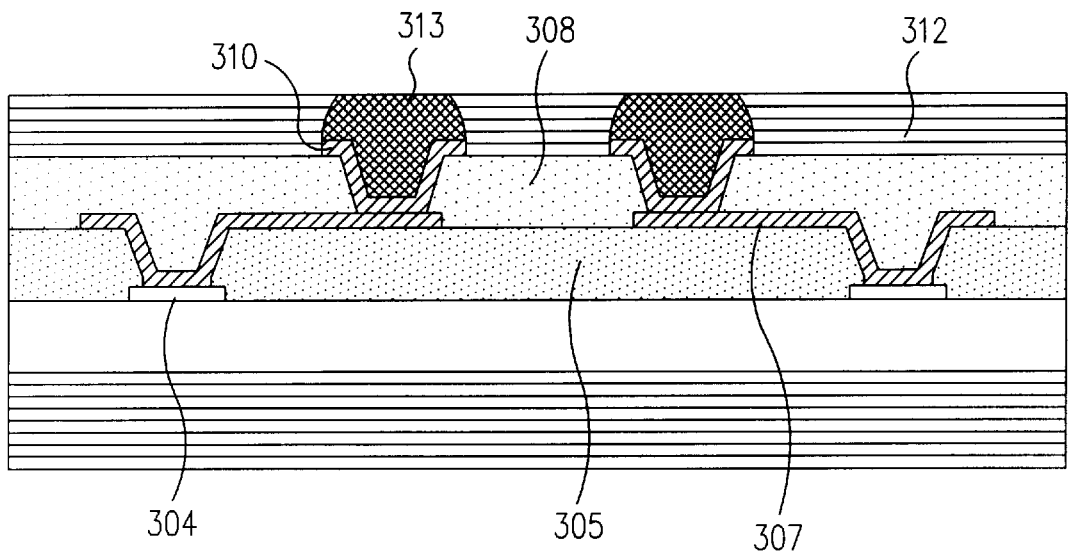

After the encapsulation step, the entire structure, including the metal bumps 311, is covered by the encapsulant layer 312, as shown in FIG. 8b. The next step consists of exposing the metal bump regions 311 by removing the portions of encapsulant layer 312 which cover bumps 311. In one embodiment, this is achieved by mechanically polishing the encapsulated wafer in a polishing wheel with a slurry such as alumina. This mechanical polishing step removes material in a planar manner. The polishing process is continued until a thickness of the encapsulant layer 312 which is slightly in excess of the thickness covering bumps 311 is removed. As shown in FIG. 8c, this results in the removal of some material from the top portions of the bumps 311, as well. This provides a flat bump region 313 for the next level of connections. At various stages of the polishing process, the polished face could be inspected for the appearance of the flat bump regions 313, which will have a different appearance from the encapsulant. Methodologies established in the area of chemical-mechanical polishing (CMP) could also be employed for a controlled process for exposure of the metal bump regions 313.

Figure 8D:
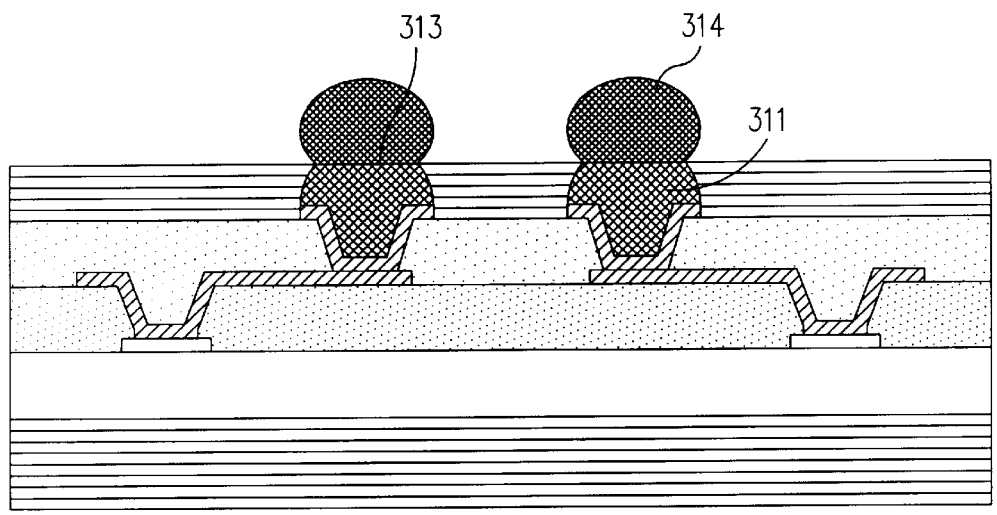

As noted above, the exposed bump regions 313 are flat, as shown as in FIG. 8c. Flat bump regions 313 are electrically connected to the chip contact pads of 304 . In order to provide external connectivity, a second plurality of metal bumps 314, shown in FIG. 8d, is deposited over these bump regions 313. Metal bumps 314 can be in the form of bumps or balls but are referred to herein as "bumps". In one embodiment, bumps 314 are formed from the selective deposition of solder from a paste over the flat bump regions 313. This is done by depositing the solder containing paste through a mechanical stencil mask which covers the entire wafer but has openings that register with the flat bump regions 313. Solder paste material is squeezed into these openings so as to deposit only over regions 311. A reflow process can then be performed. A detailed description of the process is contained in "Fine Pitch Stencil Printing of Sn/Pb and Lead Free Solders for Flip Chip Technology", J. Kloeser et al, Proc Electronic Components and Technology Conference, 1997, pp. 254–264, and "Stencil Printing Process For Low Cost Flip Chip Interconnect", by L. Li et al., Proc. Elec. Comp, and Tech. Conf., 1998, pp. 421–426, and references therein, which are incorporated herein by reference. In another embodiment, a metals could be deposited over the bump regions 311 selectively, using electroless plating techniques. This approach is suitable for depositing materials such as Ni. A description of the various methods for formation of metal bumps is contained in "Solder Bumping Methods for Flip Chip Packaging", G. A. Rinne, Proc. Electronics Components and Technology Conference, 1997, pp 241–247, which is incorporated herein by reference.

In yet another embodiment, small solder balls could be attached to the exposed to the flat bump regions 313 using established processes used in solder ball assembly in conventional ball grid array packages. In these processes, the polished wafer is coated with a flux and then solder balls are formed over the bump regions 313. The viscous flux holds the solder balls in place. The wafer is then heated in an oxygen-free environment to such temperatures at which the solder balls melt and fuse with the exposed metal connection regions This is referred to as reflow process. Due to its surface tension, the molten solder mass forms a partial spherical ball. A detailed description of solder ball based bumping is given in "Micro-ball Bump for Flip Chip Interconnections", K. Shimokawa et al, Proc. Electronics Components and Technology Conference, 1998, pp. 1472–1476, which is incorporated herein by reference.

Metal bumps 311 need to be selected from materials and compositions such that they have a higher melting temperature than the metal in the metal bumps 314. As an example, if both the metal bumps 311 and metal bumps 314 are made of solder, then 90/10 Pb/Sn solder can be chosen for the bumps 311. 90/10 Pb/Sn solder melts at above 300° Celsius. For metal bumps 314 a 63/37 Pb/Sn eutectic composition could be selected. 63/37 Pb/Sn eutectic composition melts below 275° Celsius. Therefore, during the reflow process, metal bumps 314 will melt and fuse to the flat bump regions 311, whereas bumps 311 will maintain their structural and electrical integrity.

In still other embodiments, metal bumps 314 are formed by a vacuum deposition system such as evaporation. In this method the wafer 301 with metal bumps 313 is covered with a mask. The mask has holes that register over flat metal regions 313. Metal films are deposited over regions 313. Individual layers of Pb and Sn can be deposited by metal evaporation, using RF energy or thermal heating. The respective thicknesses of the Pb and Sn layers are adjusted so as to give the desired alloy composition after a reflow process wherein the films intermix and form an alloy.

Figure 8E:
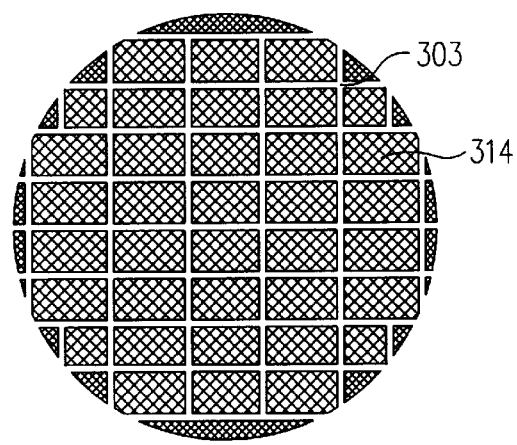
Figure 8F:
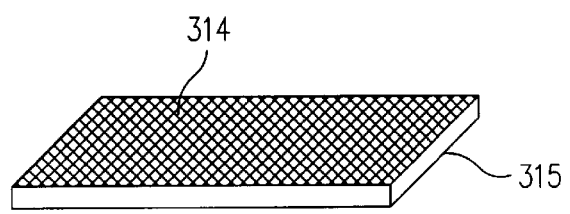

After the attachment of metal bumps 314, the encapsulated wafer 301 is sawed to yield individual chip packages. FIG. 8e illustrates a plan view of wafer 301 populated with the second layer of metal bumps which has been sawed along the scribe lines 303. After encapsulation, the surface of wafer 301 is covered with the encapsulant, and thus the scribe lines are not visible. However, since the scribe lines 303 separate adjacent IC dice, scribe lines 303 can easily be located at the midpoint between the outermost connection regions of two adjacent chips. FIG. 8f is a schematic representation of an individual package 315 with metal bumps 314 on the top face. Package 315 has the same lateral dimensions as the chip 302.

Figure 9A:
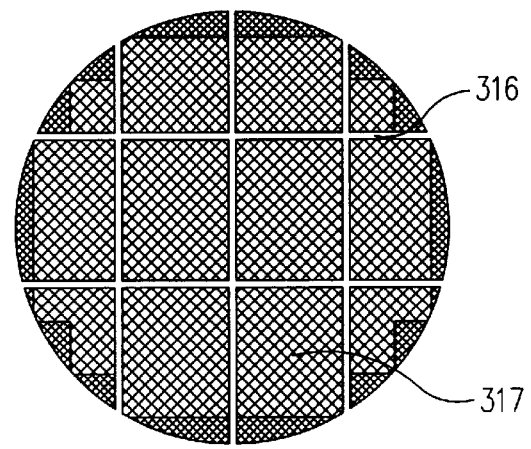
FIG. 9a to 9f correspond to a second embodiment according to the invention.
Figure 9B:
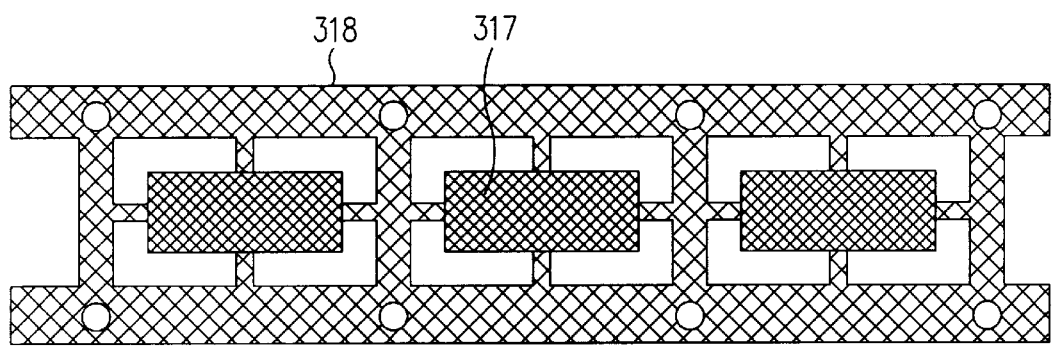
Figure 9C:
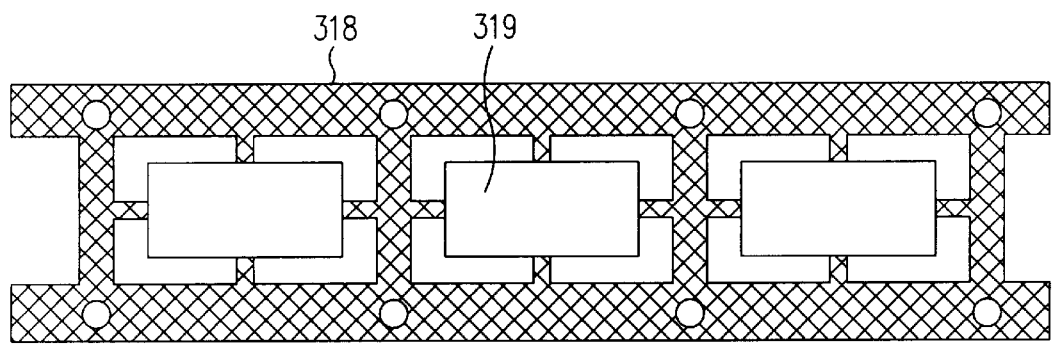
Figure 9D:
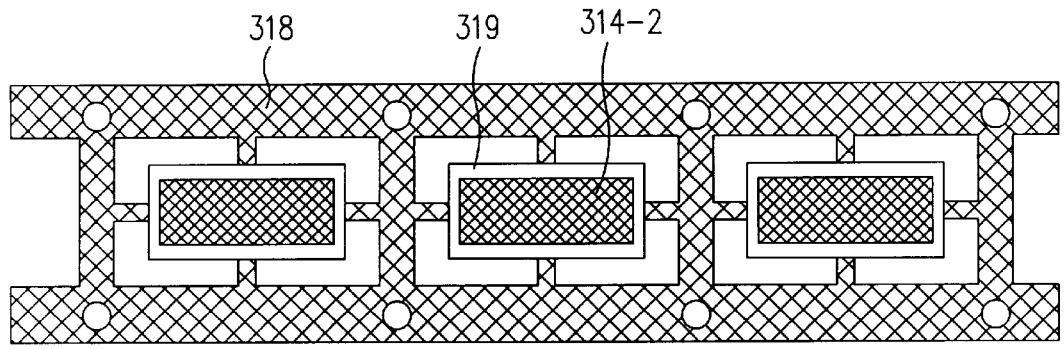

FIGS. 9a–9e illustrate a process sequence for a second preferred embodiment of this invention. In the second preferred embodiment, after wafer 301 has been populated with bumps 311 (see FIG. 6), wafer 301 is sawed to provide sections 317, each containing multiple IC chips. FIG. 9a shows scribe lines 316 along which the wafer 301 is sawed. The number of chips in each section 317 can be large. Following an established methodology known in the IC industry, wafer 301 is mounted on a sticky tape prior to the sawing . Thus, after sawing, the separated multi chip containing sections 317 are retained on the tape. Next, sections 317 are picked-up and attached to a frame 318 using a methodology established in IC packaging. The frame 318 and the attached wafer sections 317 undergo an encapsulation step next. In this step, wafer section 317 and some regions of the frame 318 are encapsulated in a polymeric resin composition. The encapsulation step covers all sides of sections 317, yielding the encapsulated sections 319 shown in FIG. 9c. Alternatively, one could only encapsulate only the top face of section 317 containing metal bumps 311. In one embodiment, this encapsulation step can be done by using epoxy resin-based molding compounds in a transfer-molding process using established IC molding techniques. In another embodiment, this process can be done by dispensing polymeric resin paste over the top surface of segment and then baking the assembly so as to dry and cure the paste and completely encapsulate the top surface of the segment 317. Standard pneumatic controlled dispensers wherein the polymeric paste is dispensed through a nozzle orifice under pneumatic air pressure can be employed for this dispensing process. This dispensing step can be applied to encapsulate either one or both of the top and bottom surfaces of sections 317. When encapsulating both the surfaces, the top surface is encapsulated first and then the frame 318 is flipped over and the back surface of section 317 is encapsulated.

After the encapsulation step, metal bumps 311 on the encapsulated sections 319 are exposed by removing a portion of the encapsulant layer. This can be done by a method, such as mechanical polishing, as described in the first preferred embodiment, leading to exposed flat regions similar to regions 313 shown in FIG. 8c.

Figure 9E:
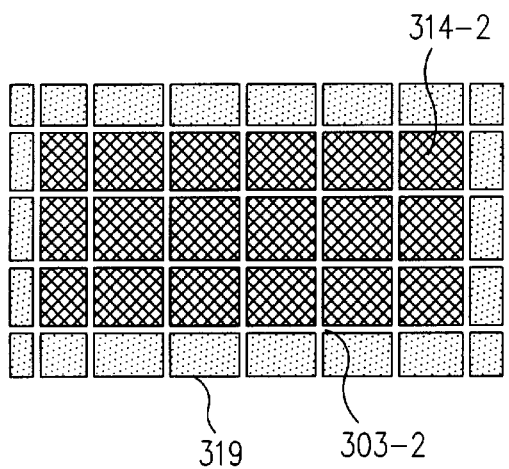
Figure 9F:
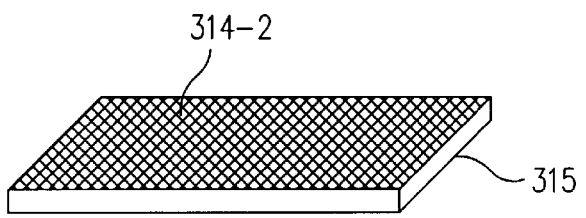

Next, another layer of connections is formed by attaching a plurality of metal bumps 314-2 over the flat regions by using the methodology described above in the first preferred embodiment. After the formation of metal bumps 314-2 (the second layer of I/O connection), the encapsulated sections 319 are separated from the rest of the frame using techniques established in the IC packaging area. Next, the separated sections 319 are sawed along the scribe lines 303-2 so as to give individual chip packages. FIG. 9e schematically illustrates the section 319 after it has been sawed-off along the scribe lines 303-2. As in the first embodiment, here too, the scribe lines 303-2 fall midway between the outermost rows of metal bumps of two adjacent chips. FIG. 9f shows the packaged chip 315 with the metal bumps 314-2 distributed on the top surface of the package.

Figure 10A:
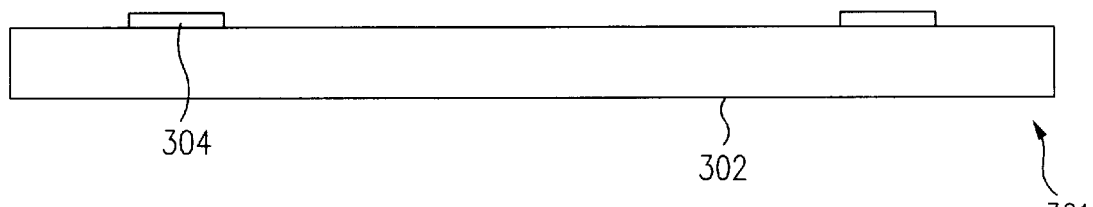
FIGS. 10a to 10h refers to the third preferred embodiment.
Figure 10B:
Figure 10C:
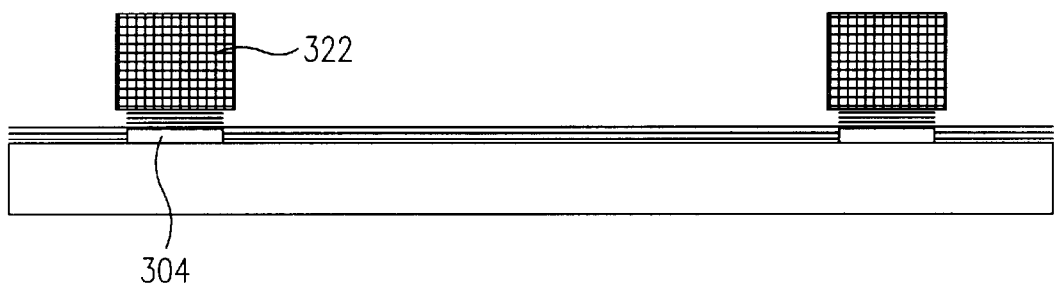

In the first and second embodiments, the first plurality of metal bumps 311 is distributed in an area array on the surface of chip 302. Metal re-distribution traces 307 and UBM layer 310 connect these metal bumps 311 to the peripheral chip contact pads 304. In an alternative embodiment, a plurality of first metal bumps are deposited directly over the chip contact pads so as to retain the peripheral distribution. This embodiment is described in detail in FIGS. 10a to 10h. The wafer 301 with chip 302 and contact pads 304 as shown in FIG. 10a, is deposited with UBM metal layer 321, as shown in FIG. 10b. The reasons for using UBM layer 321 are similar to those discussed in the earlier embodiments. Next, a plurality of first metal bumps 322 are deposited over the contact pads 304, as shown in FIG. 10c. Once again, as discussed earlier, several different approaches can be used for the deposition of the metal bumps 322. For example, in one embodiment, this is done by depositing solder paste by using a stencil mask, following the process which has been described earlier in the first and second embodiments. In another embodiment the metal bumps 322 can be deposited by electrolytic and electroless plating following a process as described earlier in the first and second embodiments. In still another embodiment, metal bumps 322 can be deposited using a wire bonder via a process as detailed earlier in the first and second embodiments.

Figure 10D:
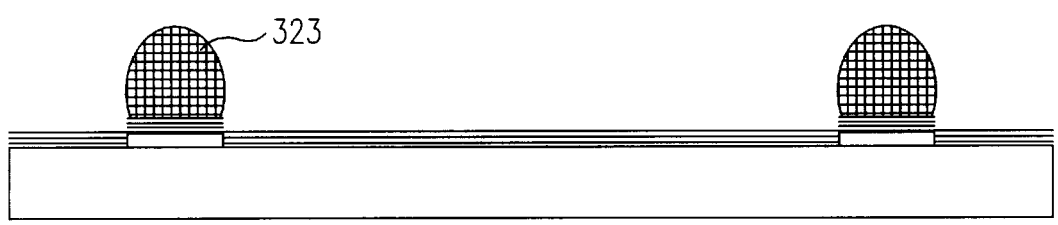

As discussed above, bumps 322 will have different shapes depending on the process of their formation. As has been discussed in the preceding embodiments, for certain metal types such as Pb/Sn based solder, the metal bumps 322 are subjected to a reflow process after their deposition, producing the bumps 323 shown in FIG. 10d. As has been discussed earlier, the reflow step melts the bump metal and fuses it with the UBM layer 321, thus ensuring good electrical and mechanical contact. The bumps 323 also attain a partial spherical shape, as shown in FIG. 10d. Next, the portions of UBM layer 321 which are exposed and not covered by the bumps 323 are removed by etching.

Figure 10E:
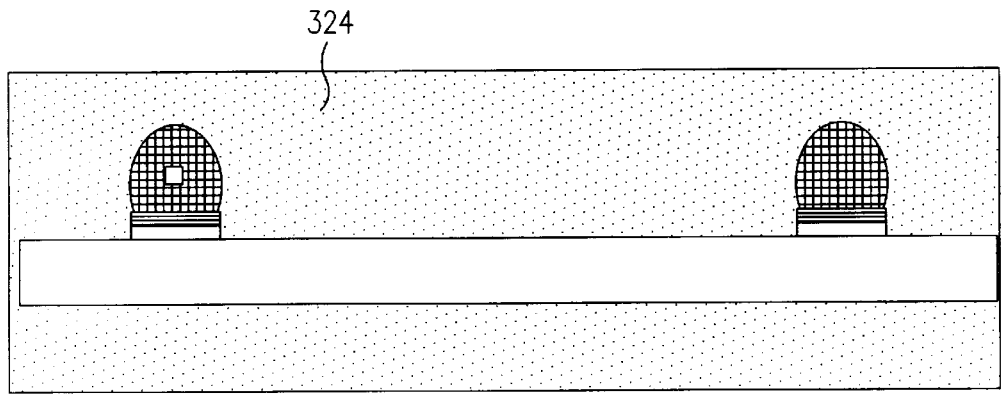
Figure 10F:
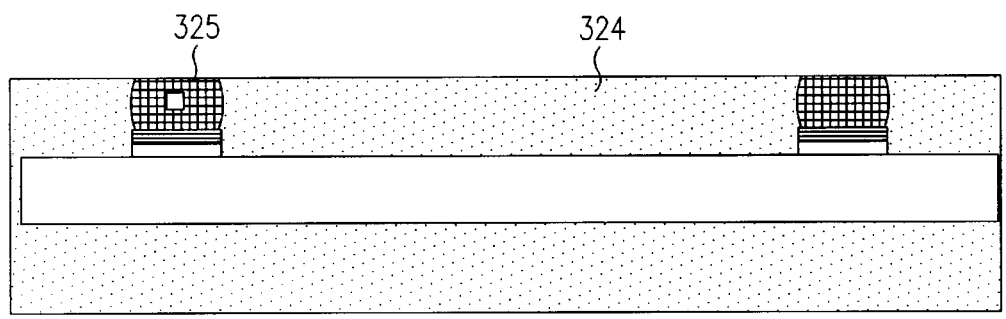
Figure 10G:
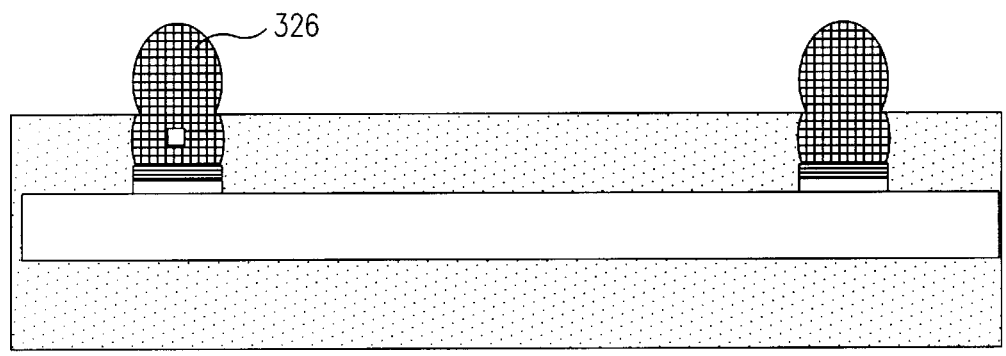
Figure 10H:
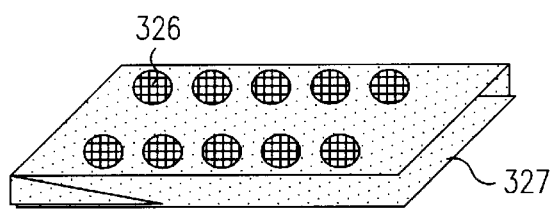

Next, wafer 301 with metal bumps 323 is encapsulated, as shown in FIG. 10e. As discussed above, several different approaches exist for the encapsulation. These include transfer molding using epoxy resin based mold compounds, lamination of polymeric films using epoxy adhesive, or applying a polymeric coating from its liquid solution and then baking it dry using approaches such as nozzle dispension, spin coating, extrusion, curtain or meniscus coating. From the encapsulation step onwards, this embodiment has the same process sequences as has been described for the two earlier embodiments. As shown in FIG. 10f, the bumps 323 are exposed by removing portions of the encapsulating layer 324, using processes such as mechanical polishing. This produces the flat metal regions 325. As in the earlier embodiments, a second plurality of metal bumps 326, shown in FIG. 10g, are attached over flat metal regions 325 by the processes described above. Next, as in previous embodiments, the wafer 301 with second plurality of metal bumps 326 is scribed along the scribe line 303 so as to provide individual chip packages 327 which have a plurality of metal bumps 326 formed over the connection pads 304.

Alternatively, as described above, the wafer can be saved into multi-chip sections after the metal bumps 323 have been deposited, followed by the encapsulation step performed on the sections.

In the embodiments described above, the bumps in the first and second plurality of bumps are described as being formed of a metal or a combination of metals such as Pb/Sn. It should be understood, however, that the bumps can also be composed of non-metal materials that are electrically conductive. This includes polymers that are intrinsically electrically conductive, referred to as conductive polymers, as well as polymer paste filled with metal particles or flakes so as to become electrically conductive when dried. Thus the invention is not limited to the particular materials mentioned in the description of the preferred embodiments. Likewise, the metal traces described above can also be formed of a conductive, nonmetallic material.

In the foregoing discussion, the metal bumps have been shown as partial spherical or cylindrical geometry. But it should be understood that the bumps can have other shapes as well and that this invention will not be limited by the shapes shown in the preferred embodiments.

In the embodiments described above, the portion of the encapsulating layer over the first metal bumps is removed by using a method such as chemical-mechanical polishing. It should be understood that other methods for the removal of the encapsulating layer could also be used, such as laser ablation or wet or dry etching techniques.

The methodology described above offers several advantages. The process provides highly miniaturized chip packages which are the same size as the chip but are fully encapsulated. The assembly process uses conventional well-established proven methodology and equipment. This provides a truly low-cost volume manufacturable process because this involves simultaneous assembly of a large number of chips from a wafer. In contrast to the conventional approach which involves separation of each individual die from the wafer and then mounting it onto a carrier frame prior to encapsulation, the described methodology significantly reduces the number of processing steps, materials and thereby the cost and yield of assembly. The described methodology involves full encapsulation of the metal bumps deposited on the chip surface using materials well established in the field, such as epoxy molding compounds. This improves the reliability of the connection regions significantly. Mechanical polishing of the encapsulated wafer or wafer segments create a highly planar surface which is free from any warpage. This ensures high yields when the chips are connected to external substrates or circuitry.

Thus, the present invention provides methods whereby a large number of chips from a wafer can be assembled and encapsulated simultaneously and then sawed-off to provide chip packages which are of the same size as the chips. The present invention further provides a method which does not require the separation of each chip from a wafer and then mounting each chip on a dedicated region of a frame before encapsulation. The present invention also provides a package with low inductance. Additionally, the present invention provides a configuration whereby the bumped wafer metal connection regions are fully embedded in the encapsulant layer thereby significantly improving the reliability of the package.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, thereby to enable others skilled in the art best to utilize the invention and various embodiments with various modifications suited to the particular use contemplated. It is intended that the scope of the invention be defined by the claims appended hereto and their equivalents.

I claim:

1. A semiconductor chip package comprising:
    a semiconductor chip having a plurality of contact pads;
    a first dielectric layer overlying the chip and containing a hole, the hole overlying one of the contact pads;
    a conductive trace extending from a location inside the hole along a surface of the first dielectric layer, the conductive trace being in electrical contact with the pad;
    a second dielectric layer overlying the first dielectric layer and conductive trace and containing a second hole, the second hole overlying the trace;
    a first conductive bump formed in the second hole and extending above the second dielectric layer;
    an encapsulant layer overlying the second dielectric layer, the first conductive bump extending through the encapsulant layer; and
    a second conductive bump on top of and in electric contact with the first conductive bump.

2. The semiconductor chip package of claim 1 wherein a side edge of the first and second dielectric layers and the encapsulant layer is located directly over a side edge of the semiconductor chip.

3. The semiconductor chip package of claim 1 wherein a side edge of the first and second dielectric layers and the encapsulant layer is coplanar with a side edge of the semiconductor chip.

4. The semiconductor chip package of claim 1 wherein:
    the first dielectric layer contains a first plurality of holes, each of the first plurality of holes overlying one of the contact pads;
    a plurality of conductive traces extend from a location inside the first plurality of holes, respectively, each of the conductive traces being in electrical contact with one of the contact pads;
    a second dielectric layer contains a second plurality of holes, each of the second plurality of holes overlying one of the traces and being lined with a conductive layer in electrical contact with the trace;
    a plurality of first conductive bumps are formed in the second plurality of holes, respectively;
    each of the plurality of first conductive bumps extends through the encapsulant layer; and
    a plurality of second conductive bumps are formed on top of and in electric contact with the plurality of first conductive bumps, respectively.

5. The semiconductor chip package of claim 1 wherein the second conductive bump has a flat top portion that is coplanar with a surface of the encapsulant layer.

6. A semiconductor chip package comprising:
    a semiconductor chip having a plurality of contact pads;
    a first conductive bump in electrical contact with the contact pad;
    an nonconductive encapsulant layer overlying the semiconductor chip and surrounding the conductive bump, the first conductive bump extending through the encapsulant layer; and
    a second conductive bump on top of and in electric contact with the first conductive bump.

7. The semiconductor chip package of claim 6 wherein a side edge of the encapsulant layer is located directly over a side edge of the semiconductor chip.

8. The semiconductor chip package of claim 6 wherein a side edge of the encapsulant layer is coplanar with a side edge of the semiconductor chip.

* * * * *